United States Patent [19]

Yen

[11] Patent Number: 5,203,961
[45] Date of Patent: Apr. 20, 1993

[54] WET DIE CUTTER ASSEMBLY AND METHOD

[76] Inventor: Yung-Tsai Yen, 196 Tuscaloosa Ave., Atherton, Calif. 94025

[21] Appl. No.: 763,422

[22] Filed: Sep. 20, 1991

[51] Int. Cl.$^5$ .......................... B44C 1/22; B79C 37/00
[52] U.S. Cl. .................................... 156/645; 156/345; 156/630; 156/633; 156/654; 156/668
[58] Field of Search ............... 156/635, 645, 654, 630, 156/633, 668, 345

[56] References Cited

U.S. PATENT DOCUMENTS

| | | | |
|---|---|---|---|
| 3,915,770 | 10/1975 | Santillo | 156/654 X |
| 4,735,678 | 4/1988 | Mandigo et al. | 156/645 X |
| 4,797,177 | 1/1989 | Kaya et al. | 156/645 X |

Primary Examiner—William A. Powell
Attorney, Agent, or Firm—Kolisch, Hartwell, Dickinson, McCormack & Heuser

[57] ABSTRACT

A wet die cutter assembly is disclosed for eating through a membrane that is soluble in a solvent. The assembly includes a supply of such a solvent and die cutter structure with a membrane-confronting surface in wetting communication with the supply. In one embodiment, the structure also includes a solvent retainer in communication with the supply and the surface for retaining solvent and making it available for pooling on the surface. The retainer includes an absorbent for drawing solvent to the surface. The surface may be blunt and may be configured in a desired shape for effecting dissolving of the membrane in a shape corresponding to that of the surface.

12 Claims, 1 Drawing Sheet

U.S. Patent
Apr. 20, 1993
5,203,961
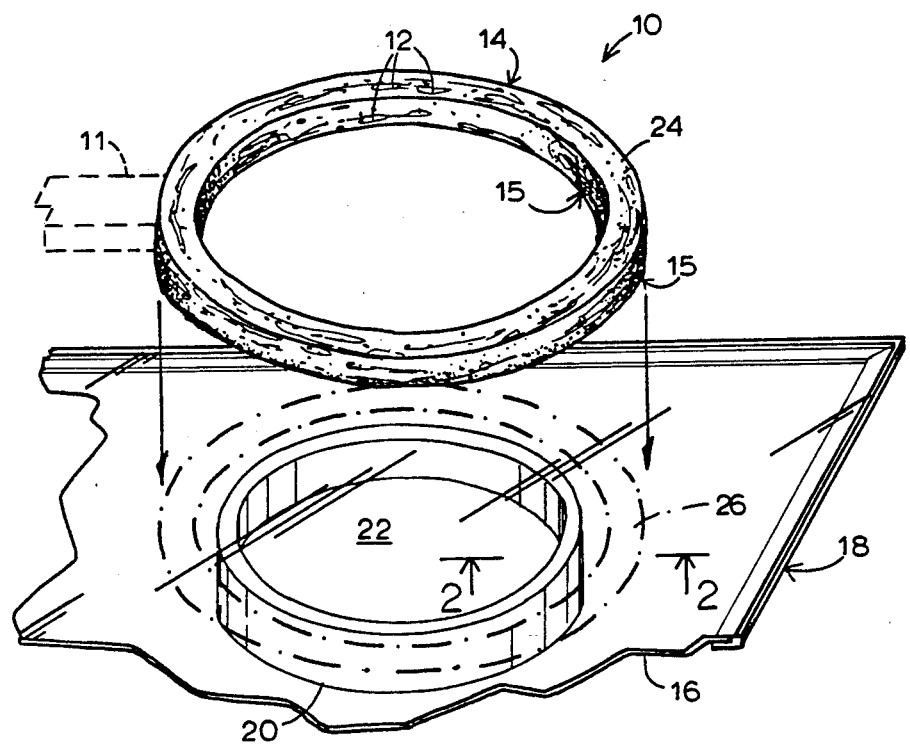
FIG.1
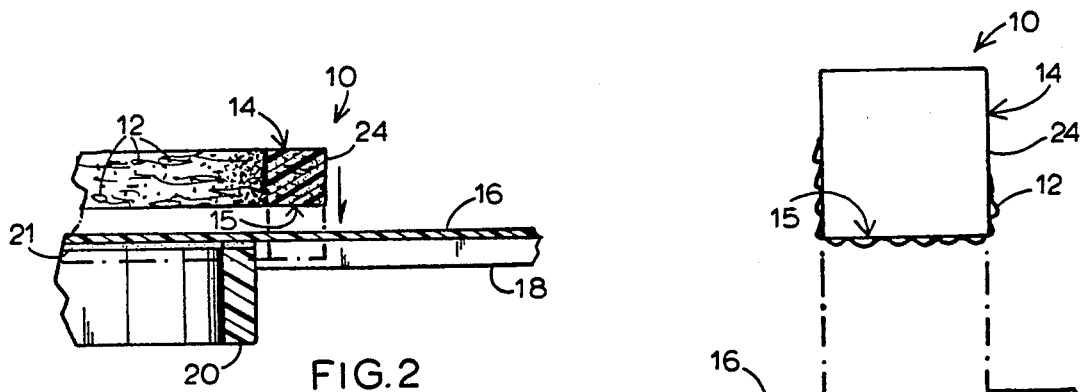
FIG.2
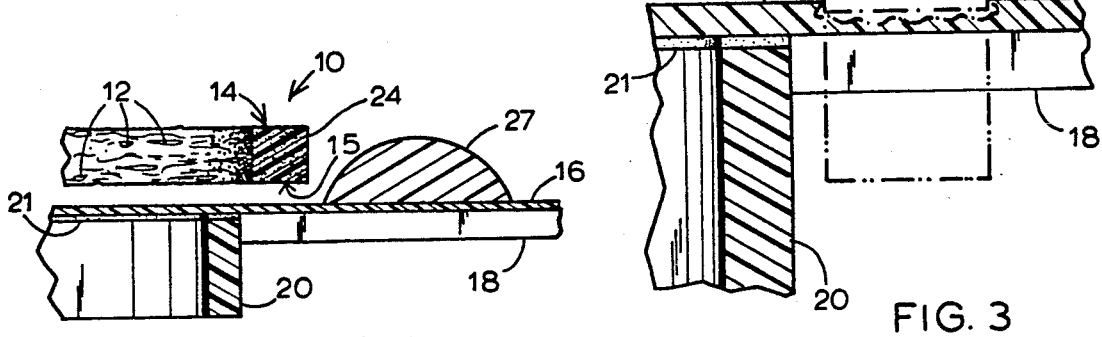
FIG.4
FIG.3

WET DIE CUTTER ASSEMBLY AND METHOD

BACKGROUND OF THE INVENTION

The present invention relates to pellicles that are used in the semi-conductor chip industry, and more particularly to a wet die cutter assembly and method usable in connection with the manufacture of pellicles.

In the semi-conductor chip industry it is well known that pattern transfer from the photo mask to substrate is accomplished by directing light from a suitable light source through the mask to the substrate. During the pattern transfer process, also called the photolithographic process, the patterns on the photo mask are projected onto the substrate which has been treated with a photo-sensitive substance. This results in the mask pattern being reproduced on to the substrate.

A manufacturing problem is encountered when foreign substances are present on the surface of the mask. There is a problem because foreign substances on the mask surface will also be reproduced on the substrate and therefore will interfere with proper pattern transfer.

To eliminate contamination of the mask surface, a framed, thin membrane known as a pellicle is mounted on it. The pellicle membrane extends parallel to the mask, and at a predetermined distance spaced away from the mask. Any contamination which would ordinarily land on the mask surface, falls onto the pellicle membrane rather than onto the mask.

Pellicles eliminate the above problem because contamination on the pellicle membrane will not be projected onto the substrate. The frame of the pellicle supports the membrane at a distance spaced away from the mask surface so any particles or other contaminants on the pellicle membrane will be out of focus during pattern transfer.

The use of pellicles can increase the quality of the resulting circuit, thereby dramatically improving circuit fabrication productivity. Consequently, it is no surprise that pellicle manufacturing techniques have become increasingly important because high quality pellicles are critical to the success of the photolithographic process.

During the pellicle manufacturing process, it is important to minimize the possibility of either relatively large or small contaminant particles being deposited on the pellicle membrane. Relatively large particles are unacceptable because they may be reproduced in the substrate during photolithography even though they are out of focus. Equally unacceptable are particles (whether large or small) that are deposited on the underside of the pellicle membrane or the pellicle frame. Such particles may drop onto the mask surface during photolithography which is precisely what is to be avoided by using pellicles.

It is also critical that the pellicle membrane be extremely uniform across its surface. Membrane uniformity ensures that light passing through the membrane during photolithography will not be obstructed or refracted in any way. The composition of the membrane must be highly uniform, and the membrane must be tensioned evenly across the pellicle frame. Also, it is important to ensure that a continuous seal exists between the relatively thin membrane and the frame.

To further understand these important requirements, it is necessary to provide an explanation of how pellicles are formed.

As is known in the art, forming an optical membrane is the first step in pellicle manufacture. Commonly the membrane is prepared by spinning a suitable polymer, such as nitrocellulose or a nitrocellulose-containing polymer, on a substrate. The newly formed membrane is then removed from the substrate and held under tension, adjacent its periphery, to prepare it for subsequent manufacturing steps.

Next, a frame is fastened or bonded to a working area of the membrane, framing the working area. After fastening, the framed working area is ready to be separated from the remaining area of the membrane.

It is this separating step that is of the utmost importance to high quality pellicle manufacture. For it is during the separating step that the framed working area must be cut away from the remainder of the membrane. Using the assembly and method of the present invention, a surprisingly successful separation is obtained.

Currently, it is known to remove the framed working area by cutting the membrane outward of the frame using a suitable knife, or razor blade. Alternatively, solvent or heat may be used in a conventional process to cut the membrane. The problem with such a procedure is that the initial puncturing of the membrane by the knife causes "shattering" of the membrane in the non-working area which produces contaminant particles that may collect on the frame or working area.

Additionally, the membrane may tear in undesired directions. If the tear proceeds through the bond between the frame and the membrane and into the working area, the pellicle must be rejected because it will not perform its function when the integrity of the working area is damaged.

An even greater problem exists when the tear passes into but not through the bond between the frame and the membrane. Such a tear will vary the tension of the membrane across the working area which will cause microscopic distortion that can affect the uniformity of the membrane. This distortion, which may not be visible to the naked eye, can be catastrophic because it is essential that the pellicle membrane transmit light uniformly without refraction. While equipment is often used to detect membrane distortion, such equipment is expensive and its use can slow down the production process.

Accordingly, it is a general object of the present invention to provide a unique assembly and method for cutting a membrane.

Another object of the invention is to provide a unique assembly and method for promoting shatter-free, tear-free separation of a framed working area from the remainder of a membrane.

SUMMARY OF THE INVENTION

One aspect of the invention comprises a wet die cutter assembly for eating through a membrane that is soluble in a solvent. The assembly includes a supply of such a solvent and die cutter structure with a membrane-confronting surface in wetting communication with the supply. The solvent-wetted surface is effective to eat through the membrane when the assembly and the membrane are brought in confronting relation to each other to communicate solvent wetness on the surface to the membrane.

In the preferred embodiment, the assembly includes a solvent retainer in communication with the supply and the surface for retaining solvent and making it available for pooling on the surface. The retainer includes an absorbent for drawing solvent to the surface.

Another aspect of the invention comprises a method for making a wet die cut through a membrane that is soluble in a solvent including the steps of (1) utilizing an expanse having been configured in a desired shape, (2) pooling a volume of such a solvent on the expanse, and (3) advancing the solvent-wetted expanse toward the membrane to promote dissolving of the membrane by the solvent on the expanse, and thereby make a wet die cut through the membrane.

By using the assembly and method of the present invention, the drawbacks encountered with the prior art tools and methods are not experienced. The wet die cutter assembly of the present invention is usable to make a shatter-free, tear-free cut in the membrane outward of the framed working area. The solvent-wetted surface of the die cutter structure works surprisingly well when used to eat through the membrane to separate the framed working area from the remainder of the membrane.

The various objects and advantages which are attained by the invention will become more fully apparent as the description which now follows is read in conjunction with the drawings.

DESCRIPTION OF THE DRAWINGS

FIG. 1 is an isometric view of the preferred embodiment of the assembly of the present invention shown in position over a framed working area of a membrane.

FIG. 2 is an enlarged, fragmentary, side sectional view taken along line 2—2 of FIG. 1.

FIG. 3 is a further enlarged, partially schematic view of FIG. 2 showing the solvent-wetted surface of the die cutter structure.

FIG. 4 is like FIG. 2 except that the assembly of the present invention is shown being used with a membrane that has had applied to it a border for reducing the tension of the membrane.

DETAILED DESCRIPTION OF THE INVENTION

Turning now to the drawings, FIGS. 1 and 3 show a wet die cutter assembly 10 constructed according to the present invention and suitably attached to an outer die cutter plate, a fragmentary portion being shown by dot-dash lines 11. A supply 12 of solvent (shown best in FIG. 3) is retained within die cutter structure 14. Structure 14 includes a blunt, membrane-confronting surface 15 (also referred to herein as an expanse) in wetting communication with the supply. It should be understood that surface 15 may be constructed to define a sharper edge if desired. Surface 15 (and structure 14) may be configured in a ring-like shape as depicted in the drawings, or configured in other desired shapes.

In FIGS. 1-3, assembly 10 is shown above a transparent pellicle membrane 16 which may be formed by any conventional method, such as by spinning a polymer formulation on a substrate (undepicted). As is common, membrane 16 is formed from a nitrocellulose polymer.

Membrane 16 is attached to and tensed by a peripheral frame 18. Attachment of the membrane and peripheral frame may be accomplished by any of the usual methods such as by adhesion or friction. A support frame 20 has been fastened to the underside of membrane 16 by gluing to form a continuous bond. A portion of such bond is shown at 21 in FIGS. 2 and 3 between support frame 20 and membrane 16. Attachment of support frame 20 to membrane 16 defines a working area 22. The remainder of membrane 16, i.e. that portion that is outward of support frame 20, is separated and discarded as soon to be described.

Still referring to FIGS. 1 and 3, supply 12 is retained in structure 14 by a solvent retainer 24 constructed from an absorbent. Retainer 24 retains solvent and makes it available for pooling on surface 15 as shown in FIG. 3. The absorbent draws solvent to surface 15 and may be formed of a natural substance, such as a sponge, or synthetic material. The supply of solvent may be provided in larger amounts than storable in retainer 24. In such a case, the supply may be positioned in a suitable reservoir (undepicted) with suitable tubing (undepicted) for feeding solvent to retainer 24.

The solvent is preferrably acetone, but any solvent suitable for dissolving a membrane may be used. Acetone is particularly effective for eating through or dissolving the usual nitrocellulose-based pellicle membranes.

Referring to FIGS. 2 and 3, assembly 10 is movable bidirectionally with respect to membrane 16 to bring both in confronting relation to each other. Any known device (undepicted) may be used to effect bidirectional movement of assembly 10 by connecting the same to plate 11. Alternatively, assembly 10 may be moved by hand, in which case plate 11 may be omitted.

Referring to FIG. 4, assembly 10 may be used to separate a framed working area from a membrane 16 to which a border 27 has been applied according to the teachings in copending application Ser. No. 07/749,709, filed Aug. 26, 1991, entitled "Process and Apparatus for Controllably Separating Framed Working Area from Remainder of the Membrane," which application is incorporated herein by reference. This is the preferred mode of practicing the invention.

In the figures, a space is shown between expanse 15 and support frame 20. In actuality, this space would usually be much smaller than depicted so that use of the depicted embodiment does not require an additional membrane removal step to clean the peripheral edge of the now-cut membrane 16. In certain applications, however, such spacing may be included. In such applications, an additional membrane dissolving step would normally be included, using a conventional dissolving or cutting tool.

Operation

Referring to FIGS. 1-3, assembly 10 and membrane 16 are brought toward each other in confronting relation so that solvent-wetted surface 15 of structure 14 communicates solvent wetness on the surface of membrane 16 inside track 26 (FIG. 1) shown by dot-dash lines.

Referring to FIG. 3, solvent-wetted surface 15 will effect eating through of the membrane by the solvent as assembly 10 is moved gradually downwardly through membrane 16 to the position shown by dot-dash lines and then to the position shown by double-dot-dash lines.

Referring again to FIGS. 1-3, the invention also embodies a method for making a wet die cut through membrane 16 by utilizing expanse 15 which has been configured in a desired shape, i.e. a ring-like shape. Next, a volume of solvent from supply 12 is pooled on the expanse by retainer 24 via its absorbent construction. The solvent-wetted expanse is then advanced toward membrane 16 to promote dissolving of the membrane portion within track 26 (FIG. 1) by the presence of solvent on expanse 15, thereby making a wet die cut through the membrane.

Still referring to FIGS. 1-3, the invention also embodies a method for making a configured wet die cut through membrane 16. The method involves configuring in a desired shape (i.e. ring-like) membrane-dissolving surface 15 of die cutter structure 14. Next, the surface is wetted with a solvent from supply 12 to effect dissolving of the membrane by the solvent. A configured wet die cut is made in the membrane by confronting wetted surface 15 with membrane 16 to allow the wetted surface to dissolve the membrane in the shape of track 26 (FIG. 1) which shape corresponds to that of surface 15.

Accordingly, while the preferred method of practicing the present invention and a preferred embodiment of the assembly of the present invention has been described, other variations and modifications are possible and may be made without departing from the spirit of the invention.

What is claimed and desired to secure by Letters Patent:

1. A wet die cutter assembly for eating through a membrane that is soluble in a solvent comprising:
   a supply of such a solvent; and
   die cutter structure with a membrane-confronting surface in wetting communication with the supply for effecting eating through of the membrane by the solvent-wetted surface when the assembly and the membrane are brought in confronting relation to each other to communicate solvent wetness on the surface to the membrane.

2. The assembly of claim 1 wherein the structure further includes a solvent retainer in communication with the supply and the surface for retaining solvent and making it available for pooling on the surface.

3. The assembly of claim 2 wherein the retainer includes an absorbent for drawing solvent to the surface.

4. The assembly of claim 1, 2 or 3 wherein the surface is blunt.

5. A wet die cutter assembly for making a configured die cut through a membrane that is soluble in a solvent comprising:
   a supply of such a solvent; and
   die cutter structure with a membrane-confronting surface configured in a desired shape and in wetting communication with the supply for effecting dissolving of the membrane in a shape corresponding to that of the solvent-wetted surface when the assembly and the membrane are brought in a confronting relation to each other to communicate solvent wetness on the surface to the membrane, thereby to make a configured die cut through the membrane.

6. The assembly of claim 5 wherein the structure further includes a solvent retainer in communication with the supply and the surface for retaining solvent and making it available for pooling on the surface.

7. The assembly of claim 6 wherein the retainer includes an absorbent for drawing solvent to the surface.

8. The assembly of claim 5, 6 or 7 wherein the surface is configured in a ring-like shape.

9. The assembly of claim 8 wherein the surface is blunt.

10. The assembly of claim 7 wherein the surface is blunt.

11. A method for making a wet die cut through a membrane that is soluble in a solvent comprising:
    utilizing an expanse having been configured in a desired shape;
    pooling a volume of such a solvent on the expanse; and
    advancing the solvent-wetted expanse toward the membrane to promote dissolving of the membrane by the solvent on the expanse and, thereby making a wet die cut through the membrane.

12. A method for making a configured wet die cut through a membrane that is soluble in a solvent comprising:
    configuring in a desired shape a membrane-dissolving surface of a die cutter;
    wetting the surface with such a solvent to effect dissolving of the membrane by the solvent;
    confronting the wetted surface with the membrane to allow the wetted surface to dissolve the membrane in a shape corresponding to that of the surface, thereby making a configured wet die cut in the membrane.

* * * * *